(12) United States Patent
Miyano et al.

(10) Patent No.: US 8,111,741 B2
(45) Date of Patent: Feb. 7, 2012

(54) SAMPLING FILTER APPARATUS AND WIRELESS COMMUNICATION APPARATUS

(75) Inventors: Kentaro Miyano, Kanagawa (JP); Yoshifumi Hosokawa, Osaka (JP); Katsuaki Abe, Osaka (JP); Akihiko Matsuoka, Kanagawa (JP); Noriaki Saito, Tokyo (JP)

(73) Assignee: Panasonic Corporation, Osaka (JP)

( * ) Notice: Subject to any disclaimer, the term of this patent is extended or adjusted under 35 U.S.C. 154(b) by 637 days.

(21) Appl. No.: 12/373,860

(22) PCT Filed: Oct. 15, 2007

(86) PCT No.: PCT/JP2007/070107
§ 371 (c)(1),
(2), (4) Date: Jan. 14, 2009

(87) PCT Pub. No.: WO2008/050630
PCT Pub. Date: May 2, 2008

(65) Prior Publication Data
US 2009/0257531 A1    Oct. 15, 2009

(30) Foreign Application Priority Data
Oct. 23, 2006   (JP) ................................ 2006-287307

(51) Int. Cl.
*H03H 7/30* (2006.01)
(52) U.S. Cl. ..................................................... 375/229
(58) Field of Classification Search .................. 375/340, 375/316, 229, 230; 327/553
See application file for complete search history.

(56) References Cited

U.S. PATENT DOCUMENTS

| 5,313,438 A * | 5/1994 | Hieda et al. .................... 365/238 |
| 2009/0021296 A1* | 1/2009 | Miyano et al. ................. 327/553 |

FOREIGN PATENT DOCUMENTS

| JP | 03-160814 A | 7/1991 |
| JP | 2003-510933 A | 3/2003 |

OTHER PUBLICATIONS

International Search Report for PCT/JP2007/070107.

* cited by examiner

*Primary Examiner* — Jaison Joseph
(74) *Attorney, Agent, or Firm* — Pearne & Gordon LLP

(57) ABSTRACT

The present invention has an object to provide a sampling filter apparatus and a wireless communication apparatus, which are capable of changing a filter characteristic without employing complex waveforms as control signals, and also, capable of performing filtering process operations without performing a decimation, while utilizing a wide frequency space. A sampling filter apparatus 100 includes a controller 140, a plurality of integrators 150 to 154, a plurality of switches 130, 160 to 164, 170 to 174, 180 to 184, and a plurality of voltage/current converters 120 to 123. An inputted current is stored in four pieces of integrators selected among the plurality of integrators 150 to 154 by one clock, and electric charges which have been stored from four preceding clocks up to one preceding clock are added to each other so as to output the added electric charges from the remaining one integrator. When electric charges are stored in the integrators 150 to 154 in each clock, since the inputted current is switched, the electric charges to be outputted can be weighted, and thus, a filter characteristic is changed.

9 Claims, 14 Drawing Sheets

FIG. 3

| TIMING | 1 | 2 | 3 | 4 | 5 | 6 | 7 | 8 | 9 | 10 |
|---|---|---|---|---|---|---|---|---|---|---|
| VOLTAGE/CURRENT CONVERTER 120 | SWITCH 160 | 161 | 162 | 163 | 164 | 160 | 161 | 162 | 163 | 164 |
| VOLTAGE/CURRENT CONVERTER 121 | SWITCH 164 | 160 | 161 | 162 | 163 | 164 | 160 | 161 | 162 | 163 |
| VOLTAGE/CURRENT CONVERTER 122 | SWITCH 163 | 164 | 160 | 161 | 162 | 163 | 164 | 160 | 161 | 162 |
| VOLTAGE/CURRENT CONVERTER 123 | SWITCH 162 | 163 | 164 | 160 | 161 | 162 | 163 | 164 | 160 | 161 |

FIG. 12

| TIMING | 1 | 2 | 3 | 4 | 5 | 6 | 7 | 8 | 9 | 10 |
|---|---|---|---|---|---|---|---|---|---|---|
| SWITCH 160 | SWITCH 170 | 171 | 172 | 173 | 174 | 170 | 171 | 172 | 173 | 174 |
| SWITCH 161 | SWITCH 174 | 170 | 171 | 172 | 173 | 174 | 170 | 171 | 172 | 173 |
| SWITCH 162 | SWITCH 173 | 174 | 170 | 171 | 172 | 173 | 174 | 170 | 171 | 172 |
| SWITCH 163 | SWITCH 172 | 173 | 174 | 170 | 171 | 172 | 173 | 174 | 170 | 171 |

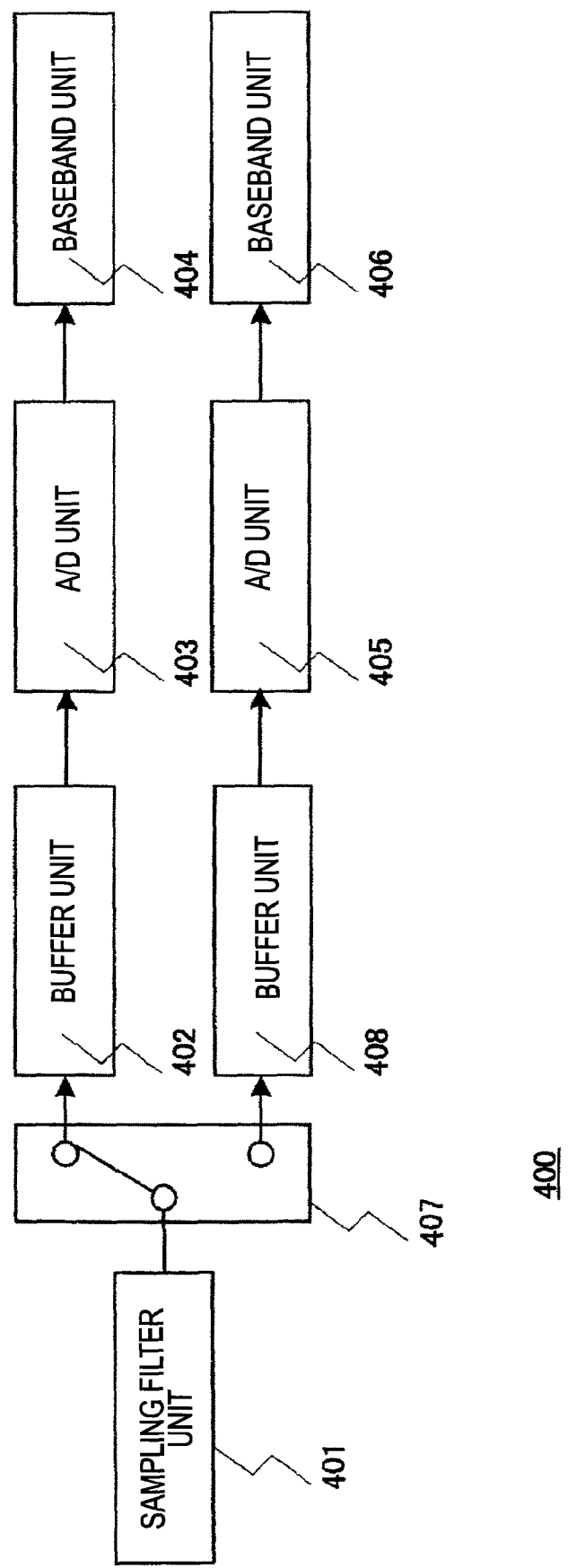

SAMPLING FILTER APPARATUS AND WIRELESS COMMUNICATION APPARATUS

TECHNICAL FIELD

The present invention is related to a sampling filter apparatus and a wireless communication apparatus, the filter characteristic of which is determined in response to an output from an integrator.

BACKGROUND ART

In wireless communication apparatuses such as mobile communications, sampling filter apparatuses have been employed, which temporally discretize signals, and perform frequency conversion and filtering operations. As known sampling filter apparatuses, for instance, such a sampling filter apparatus has been disclosed in a patent publication 1. FIG. 8 shows the known sampling filter apparatus described in the patent publication 1.

In FIG. 8, the known sampling filter apparatus includes a switch 2A, a switch 2B, an integrator 3, a weighting and sampling (W & S) element 6, and a control signal generator 7. In response to a clock, an inverted clock, a W&S signal, and a reset signal, which are generated from a control signal generator 7, three processes (namely, resetting, sampling, and holding processes) are carried out.

The filter characteristic of this sampling filter apparatus is determined based upon a weight function. Also, the weight functions depend upon combinations between the W&S element 6 and the W&S signals, while the W&S signals correspond, for instance, to three weight functions (constant, linear, and Gaussian). A signal current which passes through the W&S element 6 is zero outside a sampling window, and is weighted in accordance with the weight functions (constant, linear, and Gaussian) within the sampling window. As previously explained, the outputs of the W&S element 6 are weighted based upon the W&S signals, so that the filter characteristic can be changed.

Patent Publication 1: JP-T-2003-510933 (page 31, FIG. 2A)

DISCLOSURE OF THE INVENTION

Problems that the Invention is to Solve

In the known method described in the above-described patent publication 1, the complex waveforms must be prepared as the W&S signals for changing the filter characteristics. Also, in this method, since the decimation is carried out, there is such a problem that the frequency space of the output signal becomes very narrow.

In other words, the W&S signals of the above-explained patent publication 1 have such waveforms as shown in FIG. 9. When currents for "n" clocks are integrated based upon sampling steps of the W&S signals for a time period from a clock "1" to a clock "n", then such a decimation of a decimation ratio=n is carried out. For example, when a signal having a sampling frequency of 100 Msps is decimated by ¼, the resulting sampling frequency becomes 25 Msps. Based upon the sampling theorem, in the case of 100 Msps, signals having frequencies from 0 to 50 MHz can be monitored, and in the case of 25 Msps, signals having frequencies from 0 to 12.5 MHz can be monitored. A frequency space of an output signal implies such a frequency range capable of monitoring this output signal. If a decimation is carried out, then a sampling frequency becomes low, so that a frequency space becomes narrow. In particular, in the above-described patent publication 1, an example of n=870 is indicated in FIG. 10. The sampling frequency becomes ⅛₇₀ times lower than the original sampling frequency, so that the frequency space becomes very narrow.

The present invention has been made to solve the known problem, and has an object to provide a sampling filter apparatus and a wireless communication apparatus, which are capable of changing a filter characteristic without employing complex waveforms as control signals, and also, capable of performing filtering process operations, while utilizing a wide frequency space.

Means for Solving the Problems

In order to solve the above-explained known problem, there is provided a sampling filter apparatus according to the present invention, the filter characteristic of which is determined in response to an output from an integrator, the apparatus including: "N" pieces (symbol "N" is an integer larger than or equal to 2) of voltage/current converters which convert an input voltage into predetermined currents; "N+1" pieces of integrators which integrate the currents outputted from the voltage/current converters to output the integrated current; "N+1" pieces of charging switches which are provided at respective input stages of the "N+1" pieces of integrators; "N+1" pieces of discharging switches which are provided at respective output stages of the "N+1" pieces of integrators; a selecting switch which switches connections between the "N" pieces of voltage/current converters and the "N+1" pieces of charging switches; and a controller which controls ON timing and OFF timing as to the "N+1" pieces of charging switches and the "N+1" pieces of discharging switches respectively with respect to each of the integrators, and controls timing of switching the connections by the selecting switch, wherein the controller controls the ON timing and the OFF timing as to the charging switches and the discharging switches such that electric charges are charged from the "N" pieces of voltage/current converters into "N" pieces of the integrators selected from the "N+1" pieces of integrators, and at the same time, an electric charge is discharged from "1" piece of the integrator other than the "N" pieces of selected integrators.

In accordance with the above-described arrangement, since the filtering process operation can be carried out without executing the decimation, the filtering process operation using the wide frequency space can be realized. Also, in accordance with the above-explained arrangement, since the outputs from the integrators can be changed, the filter characteristic can be changed without employing the complex waveforms as the control signals.

Also, in the sampling filter apparatus of the present invention, the controller may control the timing for switching the connections by the selecting switch such that switching of the connections between the "N" pieces of voltage/current converters and the "N+1" pieces of charging switches are carried out every 1 clock; and the controller may control such that ON states and OFF states of the respective charging switches and discharging switches are changed every 1 clock.

In accordance with the above-described arrangement, since the filtering process operation can be carried out without executing the decimation, the filtering process operation using the wide frequency space can be realized.

Also, in the sampling filter apparatus of the present invention, when symbol "$z^{-n}$" (symbol "n" is an integer larger than or equal to 1) expresses a signal delayed by "n" samples: in such a case that "N" is even (N=2M, symbol "M" is an integer larger than or equal to 1), the controller may control electric charges integrated by the plurality of integrators for 1 clock to be multiplied by "$a_1$" times to "$a_M$" times of the input voltages, and a transfer function "y" to be expressed by y=$a_1$+

$a_2z^{-1}+\ldots+a_Mz^{-M+1}+a_Mz^{-M}\ldots+a_2z^{-N+2}+a_1z^{-N+1}$; whereas in such a case that "N" is odd (N=2M+1), the controller may control the electric charges integrated by the plurality of integrators for 1 clock to be multiplied by "$a_1$" times to "$a_{M+1}$" time of the input voltages, and the transfer function "y" to be expressed by $y=a_1+a_2z^{-1}+\ldots+a_Mz^{-M+1}+a_{M+1}z^{-M}+a_Mz^{-M-1}+\ldots+a_Mz^{-N+2}+a_1z^{-N+1}$.

In accordance with the above-described arrangement, an FIR (Finite Impulse Response) filter characteristic of "N" taps without executing the decimation can be realized.

Also, in the sampling filter apparatus of the present invention, the controller may switch internal voltages of the voltage/current converters so as to control to switch amounts of electric charges entered to the integrators.

In accordance with the above-described arrangement, the filter characteristic can be varied while the circuit arrangement is not made complex.

Also, in the sampling filter apparatus of the present invention, the "N" pieces of voltage/current converters may have voltage-to-current characteristics which are different from each other.

In accordance with the above-described arrangement, the filter characteristic can be varied while the circuit arrangement is not made complex.

Also, in the sampling filter apparatus of the present invention, the switch which switches the connections between the "N" pieces of voltage/current converters and the "N+1" pieces of integrators may include: a selecting switch for switching inputs from the "N" pieces of voltage/current converters to "N+1" pieces of outputs in response to a signal supplied from the controller; and "N+1" pieces of sampling switches for sampling the "N+1" pieces of outputs from the selecting switch in response to a signal supplied from the controller, and for supplying the sampled outputs to the "N+1" pieces of integrators.

In accordance with the above-described arrangement, an FIR filter characteristic of "N" taps without executing the decimation can be realized.

Also, in the sampling filter apparatus of the present invention, the switch which switches the connections between the "N" pieces of voltage/current converters and the "N+1" pieces of integrators may include: a selecting switch for switching inputs from the "N" pieces of voltage/current converters to "N+1" pieces of outputs in response to a signal supplied from the controller; and "N" pieces of sampling switches for sampling outputs from the "N" pieces of voltage/current converters in response to a signal supplied from the controller, and for supplying the sampled outputs to the "N+1" pieces of integrators.

In accordance with the above-described arrangement, an FIR filter characteristic of "N" taps without executing the decimation can be realized.

Also, a wireless communication apparatus according to the invention includes: the sampling filter apparatus according to the invention, which performs a discrete processing operation and a filtering process operation with respect to a radio frequency signal inputted from an antenna; a buffer unit which outputs voltages between both terminals of the plurality of integrators employed in the sampling filter apparatus; an A/D unit which digitalizes an analog signal which has been discrete-processed and outputted from the buffer unit; and a baseband unit which performs either a demodulating process operation or a decoding process operation with respect to a digital signal digitalized by the A/D unit.

In accordance with the above-described arrangement, the wireless communication apparatus using the sampling filter apparatus can be realized.

Also, a wireless communication apparatus according to the invention includes: the sampling filter apparatus according to the invention, which performs a discrete processing operation and a filtering process operation with respect to a radio frequency signal inputted from an antenna, and switches an internal voltages of the voltage/current converters in correspondence with either a first wireless communication method or a second wireless communication method so as to change amounts of electric charges charged into the plurality of integrators; a buffer unit which outputs voltages between both terminals of the plurality of integrators employed in the sampling filter apparatus;

an A/D unit which digitalizes an analog signal which has been discrete-processed and outputted from the buffer unit; a switch unit which switches outputs of the A/D unit in correspondence with either the first wireless communication method or the second wireless communication method; a first baseband unit which performs either a demodulating process operation or a decoding process operation with respect to a digital signal outputted via the switch unit from the A/D unit in correspondence with the first wireless communication method; and a second baseband unit which performs either a demodulating process operation or a decoding process operation with respect to a digital signal outputted via the switch unit from the A/D unit in correspondence with the second wireless communication method.

In accordance with the above-described arrangement, the wireless communication apparatus operable in correspondence with a plurality of wireless communication methods can be realized, while the wireless communication apparatus can switch the filter characteristics in response to the plurality of wireless communication methods by utilizing the sampling filter apparatus.

Advantage of the Invention

In accordance with the sampling filter apparatus and the wireless communication apparatus of the present invention, it is possible to provide such a sampling filter apparatus and a wireless communication apparatus, which are capable of performing the filtering operation utilizing the wide frequency space without executing the decimation, and also, capable of changing the filter characteristics thereof without requiring the complex controller, since the sampling filter apparatus is arranged in such a manner that when the electric charges are charged to the integrators, the electric charges are weighted and the weighted electric charges are processed based upon the convolution instead of changing the control signal.

BRIEF DESCRIPTION OF THE DRAWINGS

FIG. 3 is a table for representing a connection relationship of voltage/current converters according to the first embodiment of the present invention.

FIG. 12 is a table for representing another example as to a connection relationship of sampling switches according to the first embodiment of the present invention.

FIG. 14 is a block diagram for indicating an arrangement of a wireless communication apparatus according to an embodiment 4 of the present invention.

DESCRIPTION OF REFERENCE NUMERALS AND SIGNS

Figure 1:
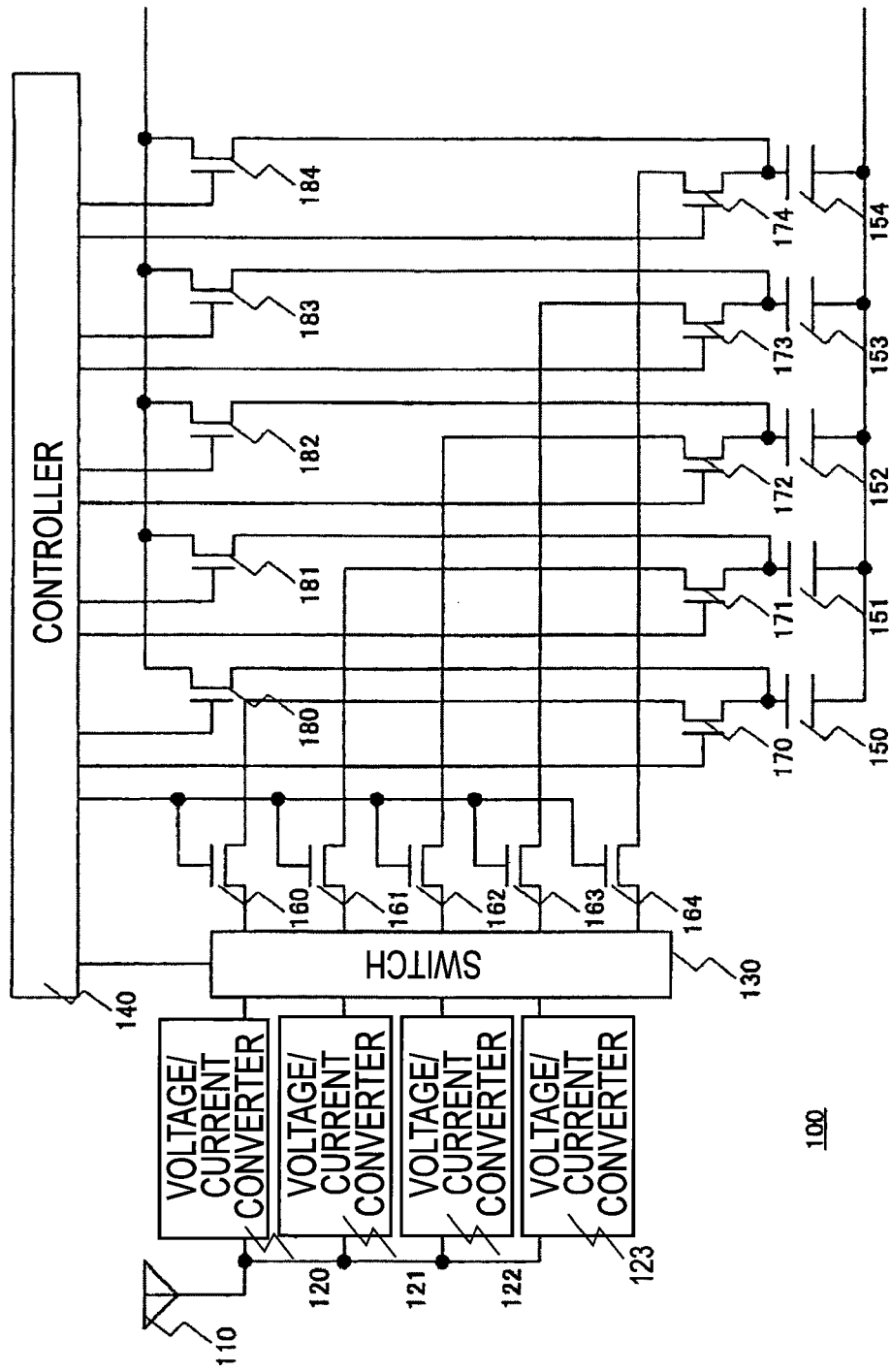
FIG. 1 is a block diagram for indicating an arrangement of a sampling filter apparatus according to a first embodiment of the present invention.

100, 201, 301, 401 sampling filter apparatus
110 antenna
120, 121, 122, 123 voltage/current converter
130 selecting switch
140 controller
150 to 154 capacitor
160 to 164 sampling switch
170 to 174 charging switch
180 to 184 discharging switch
200, 300, 400 wireless communication apparatus
202, 302, 402, 408 buffer unit
203, 303, 403, 405 A/D unit
204, 304, 306, 404, 406 baseband unit
307, 407 switch

BEST MODE FOR CARRYING OUT THE INVENTION

Referring now to drawings, a description is made of embodiments of the present invention.

(First Embodiment)

FIG. 1 is a block diagram for showing an arrangement of a sampling filter apparatus according to a first embodiment of the present invention. In the present embodiment, a description is made of such a case that the sampling filter apparatus has a filter characteristic of N=4 taps.

In FIG. 1, the sampling filter apparatus 100 includes an antenna 110, voltage/current converters 120 to 123, a selecting switch 130, a controller 140, capacitors 150 to 154, sampling switches 160 to 164, charging switches 170 to 174, and discharging switches 180 to 184.

The antenna 110 receives a radio frequency signal of a wireless method. Although not described in FIG. 1, as to the radio frequency signal received by the antenna 110, a radio frequency signal processing operation is performed which corresponds to a wireless method by, for instance, a filtering operation and the like, and then, the processed radio frequency signal is inputted to the voltage/current converters 120 to 123.

The voltage/current converters 120 to 123 convert an input voltage signal to currents and then output therefrom the converted current signals. For instance, while the voltage/current converters 120 to 123 are transconductance amplifiers, voltage-to-current characteristics of the respective voltage/current converters 120 to 123 may be different from each other, or may be alternatively made equal to each other. In the present embodiments, such an example is shown that the voltage-to-current characteristics of the voltage/current converters 120 and 123 are equal to each other, and the voltage-to-current characteristics of the voltage/current converters 121 and 122 are equal to each other, but the voltage-to-current characteristics of the voltage/current converters 120 and 121 are different from each other.

In response to a signal entered from the controller 140, the selecting switch 130 switches connection destinations of the sampling switches 160 to 164 to any of the voltage/current converters 120 to 123. In response to a signal inputted from the controller 140, the sampling switches 160 to 164 sample currents entered from the respective voltage/current converters 120 to 123, and then, outputs the sampled currents to the capacitors 150 to 154.

The capacitors 150 to 154 are connected via the charging switches 170 to 174 to the sampling switches 160 to 164, respectively. In response to the currents sampled by the sampling switches 160 to 164, when the charging switches 170 to 174 are turned ON, electric charges are charged into the capacitors 150 to 154, whereas when the discharging switches 180 to 184 are turned ON, the charged electric charges are outputted from the capacitors 150 to 154.

In response to control signals entered from the controller 140, the charging switches 170 to 174 switch whether or not electric charges are charged into the capacitor 150 to 154. In response to control signals entered from the controller 140, the discharging switches 180 to 184 switch whether or not the electric charges charged in the capacitors 150 to 154 are outputted.

Figure 2:
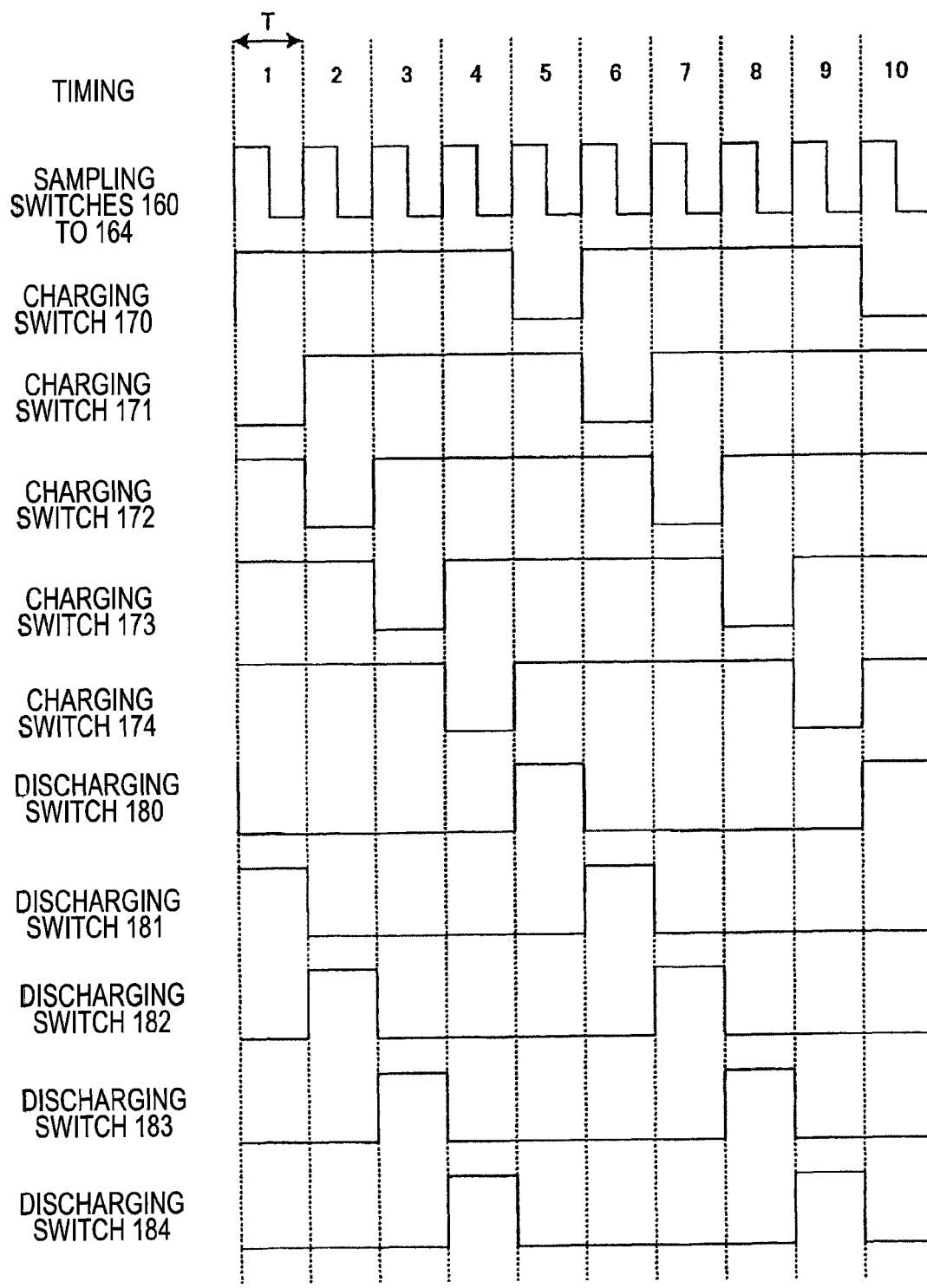
FIG. 2 is a diagram for showing a control signal of a controller according to the first embodiment of the present invention.

FIG. 2 shows control signals with respect to respective switches, namely, indicates ON timing and OFF timing of each of these switches. In the case that an operating frequency of the sampling switches 160 to 164 is 1/T [Hz], timing "1" indicates a time period of 0 to T [s]; timing "2" indicates a time period of T to 2T [s], and timing "L" indicates a time period of (L−1)×T to L×T [s].

When electric charges are charged in the capacitors 150 to 154, an ON period of each of the control signals with respect to the charging switches 170 to 174 is "4T" [s], and timings when the respective control signals are turned ON are shifted every time period "T" [s]. When the electric charges charged in the capacitors 150 to 154 are outputted, an ON period of each of the control signals with respect to the discharging switches 180 to 184 is "T" [s], and timings when the respective control signals are turned ON are shifted every time period "T" [s].

FIG. 3 indicates a connection relationship between the voltage/current converters 120 to 123 and the sampling switches 160 to 164 at the respective timing. The controller 140 controls the selecting switch 130 in such a manner that the relationship indicated in FIG. 3 can be satisfied, and repeats control operations of the timing "1" to "5."

At the timing "1", the voltage/current converter 120 is connected to the sampling switch 160; the voltage/current converter 121 is connected to the sampling switch 164; the voltage/current converter 122 is connected to the sampling switch 163; the voltage/current converter 123 is connected to the sampling switch 162, and thus, the charging switches 170, 174, 173, 172 are turned ON so as to charge electric charges into the capacitors 150, 154, 153, and 152. Also, the discharging switch 181 is turned ON so as to output the electric charges charged in the capacitor 151.

In other words, at the timing "1", electric charges are charged in the capacitor 150, which are "$a_1$" times of an input voltage (symbol "$a_1$" indicates coefficient for converting input voltage into current by voltage/current converter 120, will be discussed later in detail); electric charges are charged in the capacitor 154, which are "$a_2$" times of the input voltage; electric charges are charged in the capacitor 153, which are "$a_3(=a_2)$" times of the input voltage; and electric charges are charged in the capacitor 152, which are "$a_4(=a_1)$" times of the input voltage. As previously described, the different amounts of electric charges are charged to the plurality of capacitors at the same timing.

At the timing "2", the voltage/current converter 120 is connected to the sampling switch 161; the voltage/current converter 121 is connected to the sampling switch 160; the voltage/current converter 122 is connected to the sampling switch 164; the voltage/current converter 123 is connected to the sampling switch 163; and thus, the charging switches 171, 170, 174, and 173 are turned ON so as to charge electric charges to the capacitors 151, 150, 154, and 153. Also, the discharging switch 182 is turned ON in order to output the electric charges charged in the capacitor 152.

At the timing "3", the voltage/current converter 120 is connected to the sampling switch 162; the voltage/current converter 121 is connected to the sampling switch 161; the voltage/current converter 122 is connected to the sampling switch 160; the voltage/current converter 123 is connected to the sampling switch 164; and thus, the charging switches 172, 171, 170, and 174 are turned ON so as to charge electric charges to the capacitors 152, 151, 150, and 154. Also, the discharging switch 183 is turned ON in order to output the electric charges charged in the capacitor 153.

At the timing "4", the voltage/current converter 120 is connected to the sampling switch 163; the voltage/current converter 121 is connected to the sampling switch 162; the voltage/current converter 122 is connected to the sampling switch 161; the voltage/current converter 123 is connected to the sampling switch 160; and thus, the charging switches 173, 172, 171, and 170 are turned ON so as to charge electric charges to the capacitors 153, 152, 151, and 150. Also, the discharging switch 184 is turned ON in order to output the electric charges charged in the capacitor 154.

At the timing "5", the voltage/current converter 120 is connected to the sampling switch 164; the voltage/current converter 121 is connected to the sampling switch 163; the voltage/current converter 122 is connected to the sampling switch 162; the voltage/current converter 123 is connected to the sampling switch 161; and thus, the charging switches 174, 173, 172, and 171 are turned ON so as to charge electric charges to the capacitors 154, 153, 152, and 151. Also, the discharging switch 180 is turned ON in order to output the electric charges charged in the capacitor 150.

As a consequence, at the timing "1", a total amount of the electric charges are discharged from the capacitor 151, while the totalized electric charges are obtained by multiplying a signal of timing "−3 (3 clocks ago)" by "$a_1$", a signal of timing "−2" by "$a_2$", a signal of timing "−1" by "$a_2$", and a signal of timing "0" by "$a_1$."

Also, at the timing "2", a total amount of the electric charges are discharged from the capacitor 152, while the totalized electric charges are obtained by multiplying a signal of timing "−2" by "$a_1$", a signal of timing "−1" by "$a_2$", a signal of timing "0" by "$a_2$", and a signal of timing "1" by "$a_1$." As previously explained, the different amounts of electric charges are discharged from the plurality of capacitors at the different timing.

At timing subsequent to the timing 6, the operations of the above-described timing 1 to 5 are repeatedly carried out. The switching timing when the selecting switch 130 switches the connections between the respective voltage/current converters 120 to 123 and the respective sampling switches 160 to 164 is performed when the respective sampling switches 160 to 164 are tuned OFF. For example, at the timing "1", the connection is switched during a time period from "T/2" [s] to "T" [s].

As previously described, at each of the timing, the electric charges are charged in four pieces of the capacitors among five pieces of the capacitors, and at the same time, the electric charges which have been charged during the time periods for four sets of the timing are outputted from the remaining one capacitor. When a coefficient at which the voltage/current converters 120 and 123 convert the input voltages to the currents is defined as "$a_1$", and a coefficient at which the voltage/current converters 121 and 122 convert the input voltages to the currents is defined as "$a_2$", a transfer function "y" of the sampling filter apparatus 100 are expressed by (expression 1).

$$y = a_1 + a_2 z^{-1} + a_2 z^{-2} + a_1 z^{-3} \qquad \text{[Expression 1]}$$

In this case, since the transfer function "y" is expressed by the formula of "z", it indicates that the transfer function "y" corresponds to a discrete time method. Symbol "$z^{-1}$" represents a signal delayed by one sample. As a consequence, the output of the sampling filter apparatus 100 represents such a signal obtained by adding the latest sample signal multiplied by "$a_1$", a sample signal before 1 timing, which is multiplied by "$a_2$", a sample signal before 2 timing, which is multiplied by "$a_2$", and a sample signal before 3 timing, which is multiplied by "$a_1$" to each other.

Figure 4:
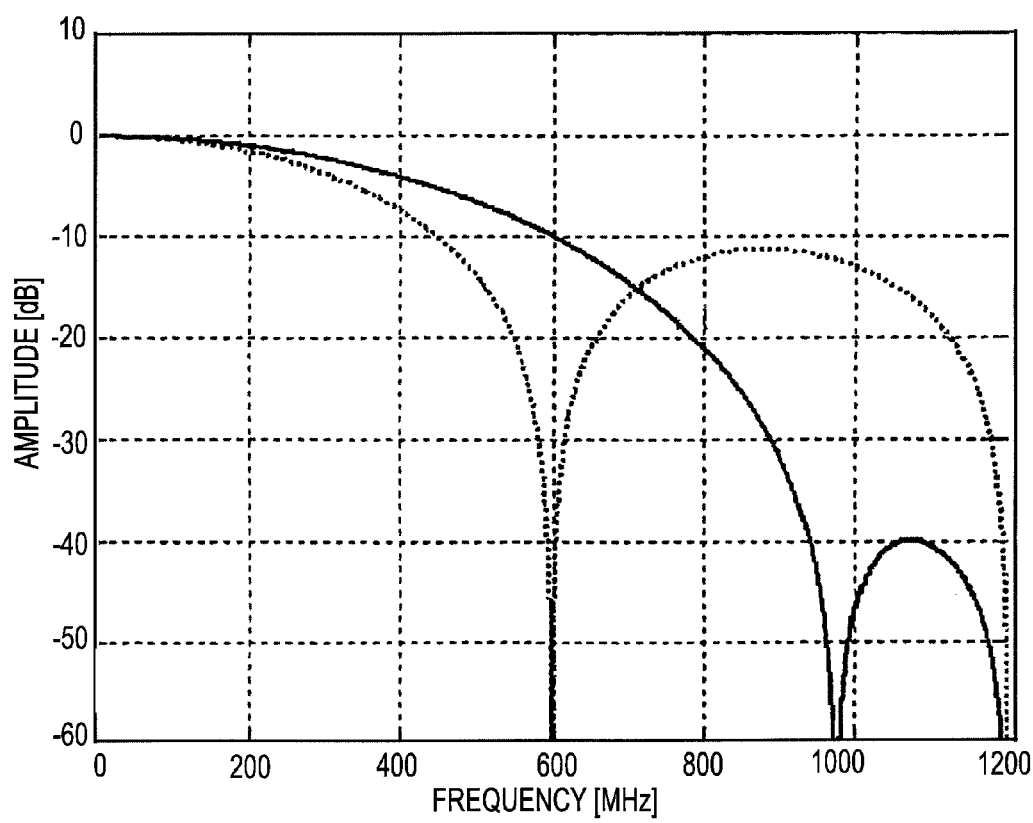
FIG. 4 is a diagram for indicating a frequency characteristic in the sampling filter apparatus according to the first embodiment of the present invention.

A solid line of FIG. 4 shows a filter characteristic achieved in such a case that "1/T" is 2400 [MHz], "$a_1$" is 0.1363, and "$a_2$" is 0.3637. On the other hand, a dotted line of FIG. 4 indicates a filter characteristic achieved in such a case that a value of "$a_1$" is equal to a value of "$a_2$." In this way, since the value of "$a_1$" and the value of "$a_2$" are changed, the filter characteristic can be changed.

In the above-described case, as the example of the sampling filter apparatus having the filter characteristic of N=4 taps, the below-mentioned arrangement has been indicated: That is, the sampling filter apparatus contains four pieces of the voltage/current converters, five pieces of the sampling switches, five pieces of the charging switches, five pieces of the discharging switches, and five pieces of the capacitors. However, the present invention is not limited to the above-explained arrangement. Since the sampling filter apparatus 100 may be arranged by containing "N" pieces of the voltage/current converters, and (N+1) pieces of each of these sampling switches, charging switches, discharging switches, and capacitors, a sampling filter apparatus having a filter characteristic of "N" taps may be alternatively arranged (symbol "N" is an integer larger than or equal to 2).

In such a case that "N" is even (N=2M, symbol "M" is an integer larger than or equal to 1), the transfer function "y" of the sampling filter apparatus 100 is expressed as (Expression 2).

$$y = a_1 + a_2 z^{-1} + \ldots + a_M z^{-M+1} + a_M z^{-M} + \ldots + a_2 z^{-N+2} + a_1 z^{-N+1} \qquad \text{[Expression 2]}$$

In such a case that "N" is odd (N=2M+1), the transfer function "y" of the sampling filter apparatus 100 is expressed as (Expression 3).

$$y=a_1+a_2z^{-1}+\ldots+a_Mz^{-M+1}+a_{M+1}z^{-M}+$$
$$a_Mz^{-M-1}\ldots+a_2z^{-N+2}+a_1z^{-N+1} \quad \text{[Expression 3]}$$

Also, in such a case that dynamic ranges of the voltage/current converters 120 to 123 are wide, since such an arrangement may be made that the internal voltages of the voltage/current converters 120 to 123 are switched so as to change amounts of electric charges charged to the capacitors, the filter characteristic may be set to be varied.

As previously described, in accordance with such an arrangement that while a plurality of voltage/current converters are equipped whose total number is equal to a tap number which is wanted to be realized, a plurality of capacitors whose total number is larger than the tap number by 1 are equipped, and charging timing and discharging timing of the respective capacitors are switched, a filtering process operation can be carried out by utilizing a wide frequency space without executing the decimation, since such a control operation is performed that when electric charges are charged to the capacitors, the electric charges are weighed, and the weighted electric charges are processed based upon the convolution. Also, a rectangular wave can be employed as the control signal, so that the filter characteristic may be changed without requiring a control signal having a complex waveform and a complex controller.

It should also be noted that not such a rectangular wave, but a sine wave may be alternatively employed as the control signal. Further, there is no specific restriction as to a sequential order of the voltage/current converters 120 to 123 when the electric charges are charged in the capacitors 150 to 154 (for example, not such a sequential order from 120 via 121, 122 to 123, but another sequential order from 123 via 122, 121 to 120).

Figure 11:
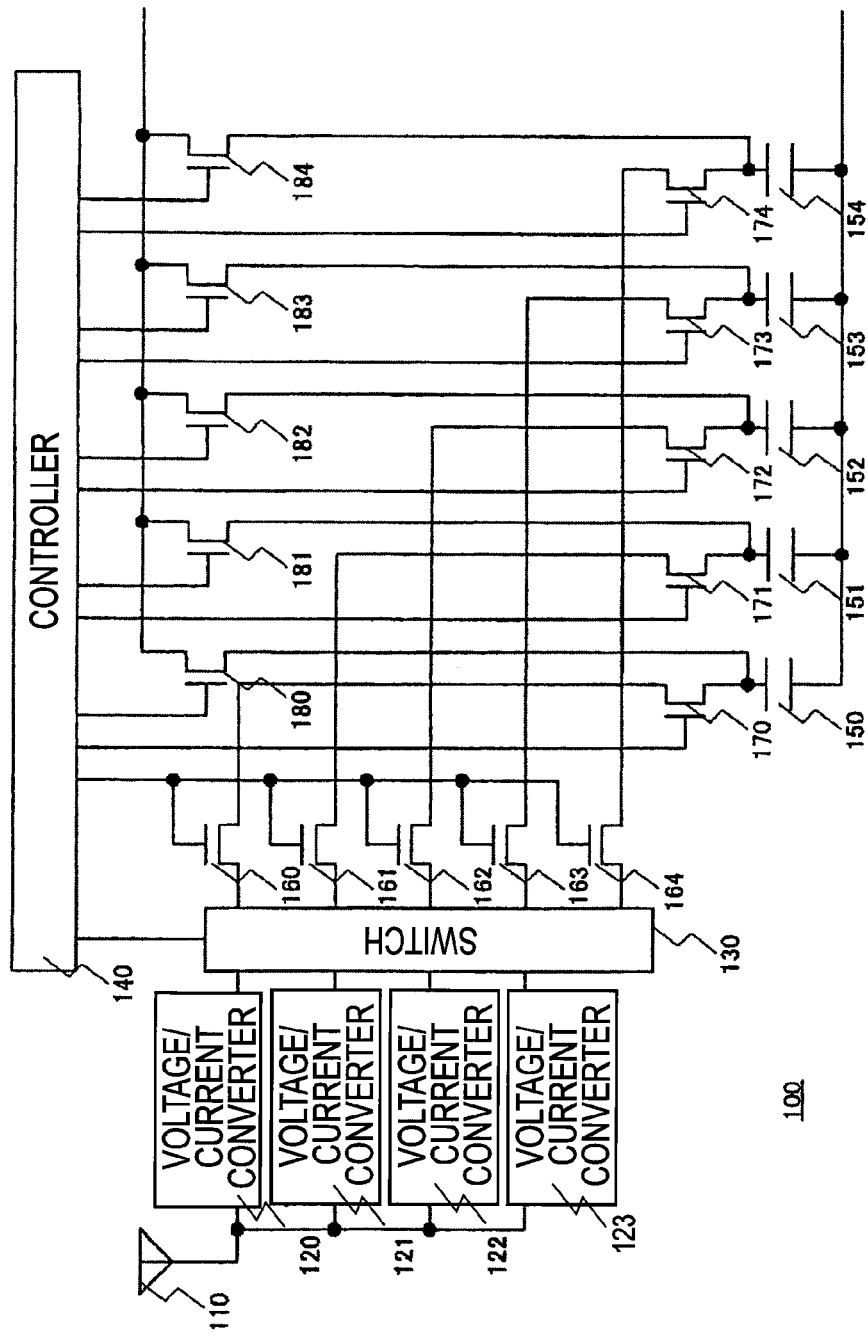
FIG. 11 is a block diagram for indicating another arrangement of the sampling filter apparatus according to the first embodiment of the present invention.

Also, as indicated in FIG. 11, another arrangement may be alternatively made in which the connections between the sampling switches 160 to 163 and the charging switches 170 to 174 are switched by the selecting switch 130, instead of the above-explained arrangement in which the connections between the voltage/current converters 120 to 123 and the sampling switches 160 to 164 are switched by this selecting switch 130. Since the arrangement shown in FIG. 11 is employed, a total number of the sampling switches may be reduced by 1. In this alternative case, a connection relationship between the sampling switches 160 to 163 and the charging switches 170 to 174 is represented in FIG. 12. The controller 140 controls the selecting switch 130 in such a manner that the relationship indicated in FIG. 12 can be satisfied, and repeatedly performs the control operations of the timing 1 to 5.

Figure 13:
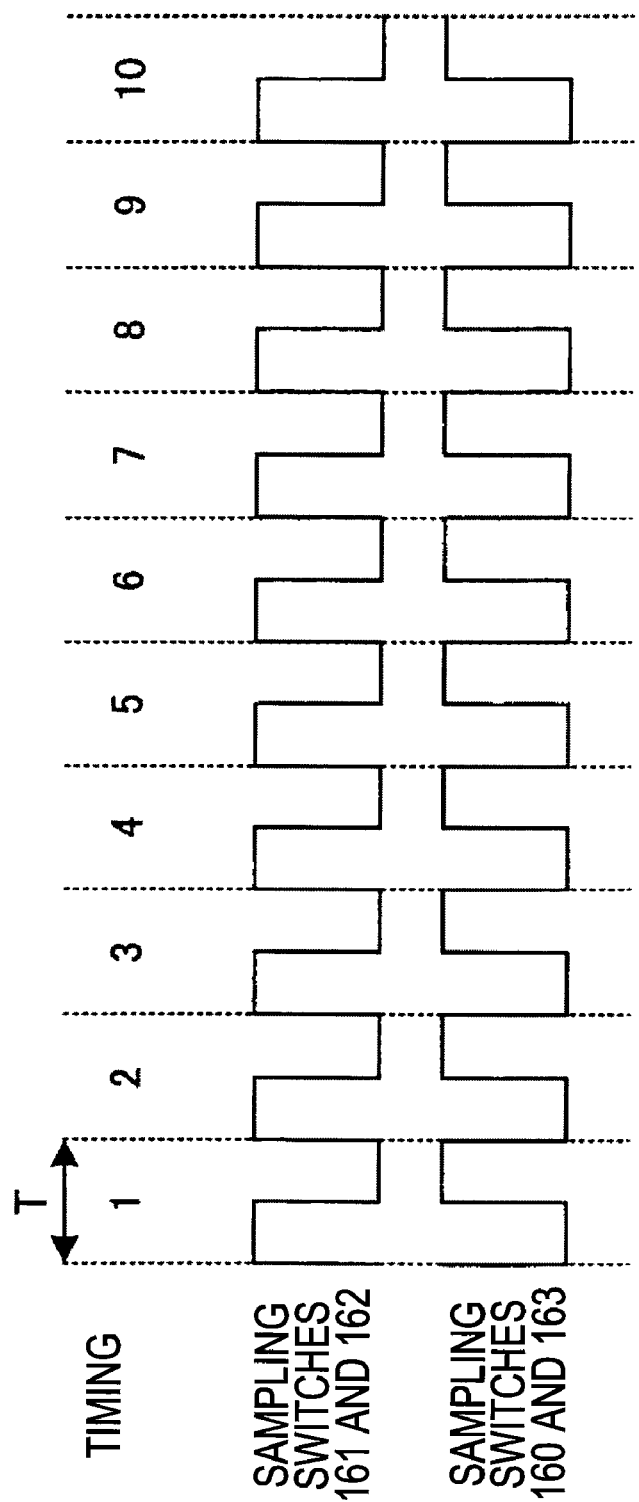
FIG. 13 is a diagram for showing another example as to the control signal of the controller according to the first embodiment of the present invention.

Moreover, in the arrangement of FIG. 11, a phase of a control signal for the sampling switches 160 and 163 can be shifted by 180 degrees with respect to a phase of a control signal for the sampling switches 161 and 162 (refer to FIG. 13), whereby the coefficient "$a_1$" may be alternatively selected to be a negative value. In this case, such a timing when the selecting switch 130 switches the connections must be prepared, for instance, such a time period must be prepared during which all the sampling switches 160 to 163 are turned OFF. In this case, a transfer function "y" of the sampling filter apparatus 100 may be expressed as (Expression 4).

$$y=-a_1+a_2z^{-1}+a_2z^{-2}-a_1z^{-3} \quad \text{[Expression 4]}$$

(Second Embodiment)

Figure 5:
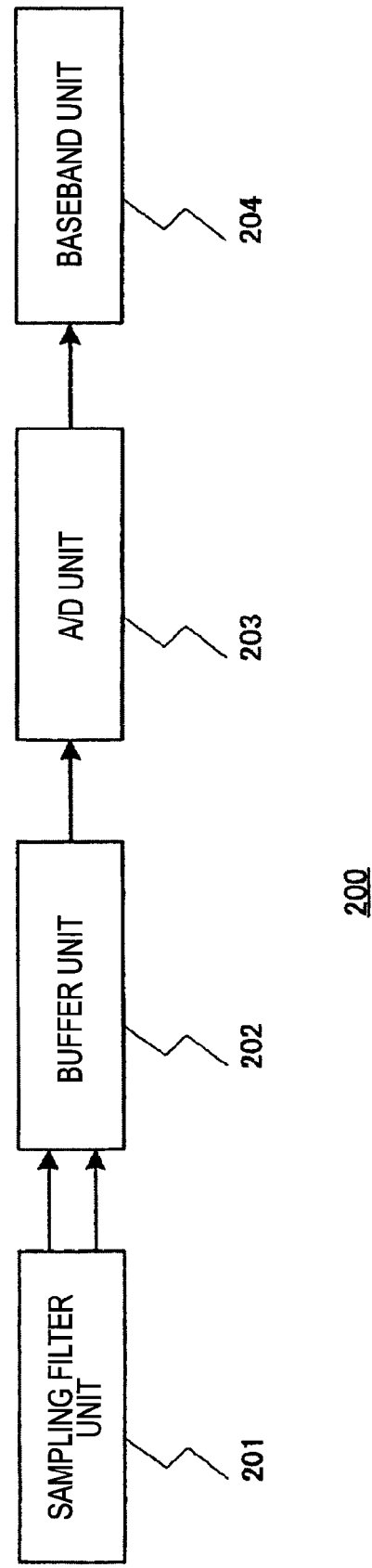
FIG. 5 is a block diagram for indicating an arrangement of a wireless communication apparatus according to a second embodiment of the present invention.

FIG. 5 is a block diagram for showing an arrangement of a wireless communication apparatus according to a second embodiment of the present invention. In FIG. 5, the wireless communication apparatus 200 is equipped with a sampling filter unit 201, a buffer unit 202, an A/D unit 203, and a baseband unit 204.

The sampling filter unit 201 has the same arrangement as that of the sampling filter apparatus 100 according to the first embodiment, and is operated in a similar manner to that of the sampling filter apparatus 100 so as to perform a discrete processing operation and a filtering process operation with respect to a radio frequency signal which is entered from the antenna 110.

The buffer unit 202 outputs voltage values appeared between both terminals of the capacitors 150 to 154 of the sampling filter unit 201. For example, the buffer unit 202 may be constructed of an operational amplifier. The voltage values at both the terminals of the capacitors 150 to 154 have such a characteristic that a component of a signal inputted from the antenna 110 is filtered by the sampling filter unit 201, while a frequency characteristic as to the voltages at both the terminals of the capacitors 150 to 154 is represented in FIG. 4.

The A/D unit 203 converts the analog discrete signal entered from the buffer unit 202 into a digital signal. The baseband unit 204 performs a digital signal processing operation with respect to the digital signal entered from the AND unit 203.

In other words, in the baseband unit 204, a demodulating process operation, a decoding process operation, and the like are carried out with respect to the digital signal digitalized by the A/D unit 203. In accordance with the above-described arrangement, the sampling filter apparatus according to the first embodiment may be applied to the wireless communication apparatus.

Although the above-description has explained such a control operation without performing the decimation, the decimation ratio may be alternatively changed by controlling the timing at which the voltage values of the respective capacitors are outputted.

Figure 6:
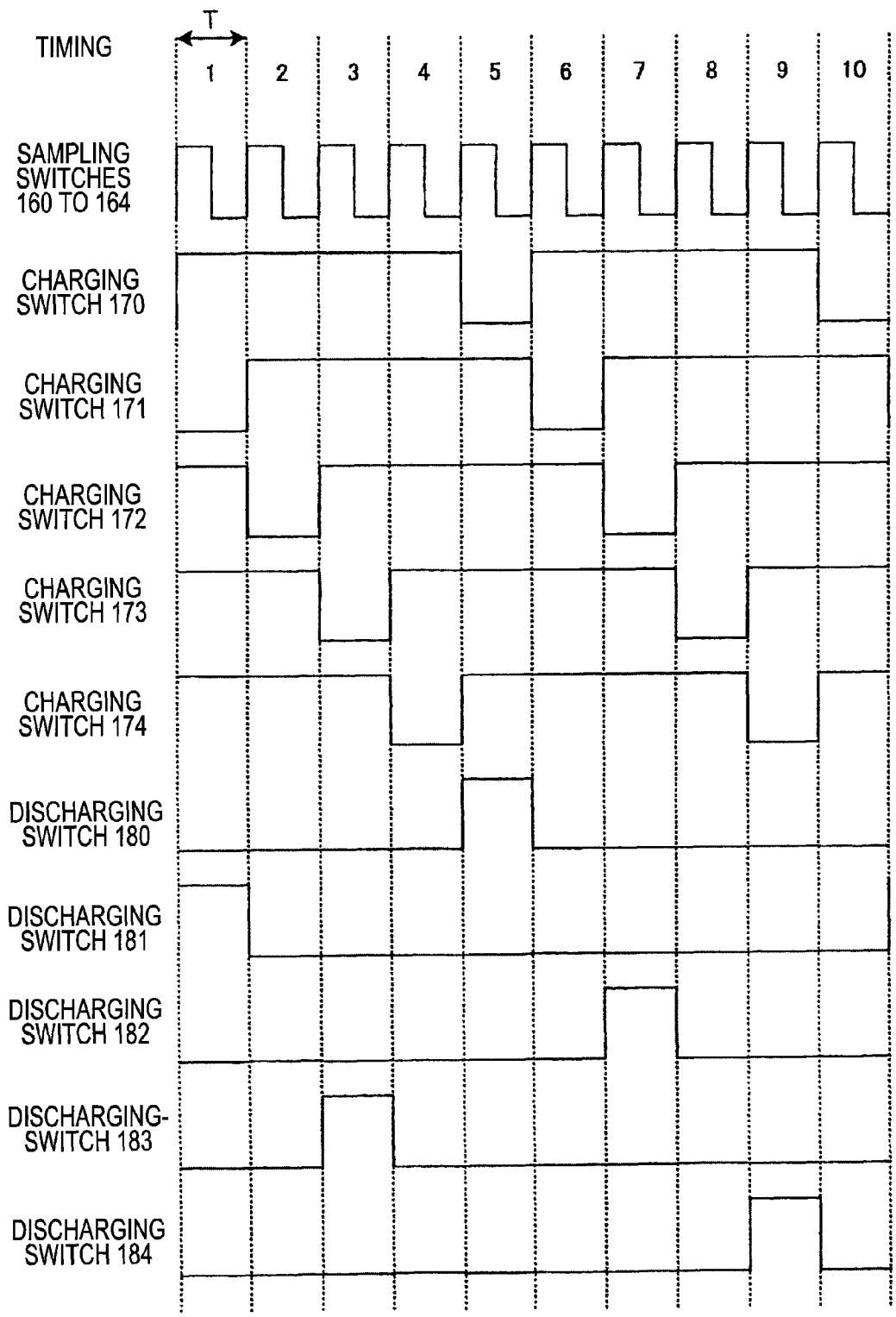
FIG. 6 is a diagram for showing another example as to a control signal of a controller according to the second embodiment of the present invention.

FIG. 6 indicates control signals with respect to the respective switches, namely shows ON timing and OFF timing of the respective switches. The ON timing and the OFF timing of the discharging switches 180 to 184 are different from those of FIG. 2. In such a case that N=4 taps, when voltage values of the respective capacitors are outputted, since the below-mentioned control operations are repeatedly carried out, the decimation ratio may be selected to be 2. In the control operations, at timing "1", the voltage value of the capacitor 151 is read; at timing "2", the voltage value of the capacitor 152 is not read; at timing "3", the voltage value of the capacitor 153 is read; at timing "4", the voltage value of the capacitor 154 is not read; at timing "5", the voltage value of the capacitor 150 is read; at timing "6", the voltage value of the capacitor 151 is not read; at timing "7", the voltage value of the capacitor 152 is read; at timing "8", the voltage value of the capacitor 153 is not read; at timing "9", the voltage value of the capacitor 154 is read; at timing "10", the voltage value of the capacitor 150 is not read. In other words, not only such a control operation that the decimation is not performed is carried out, but also the decimation ratio may be changed by the timing control operation. In such a case, the electric charges which have not been read must be reset, for example, switches for resetting the electric charges stored in the respective capacitors must be prepared.

(Third Embodiment)

Figure 7:
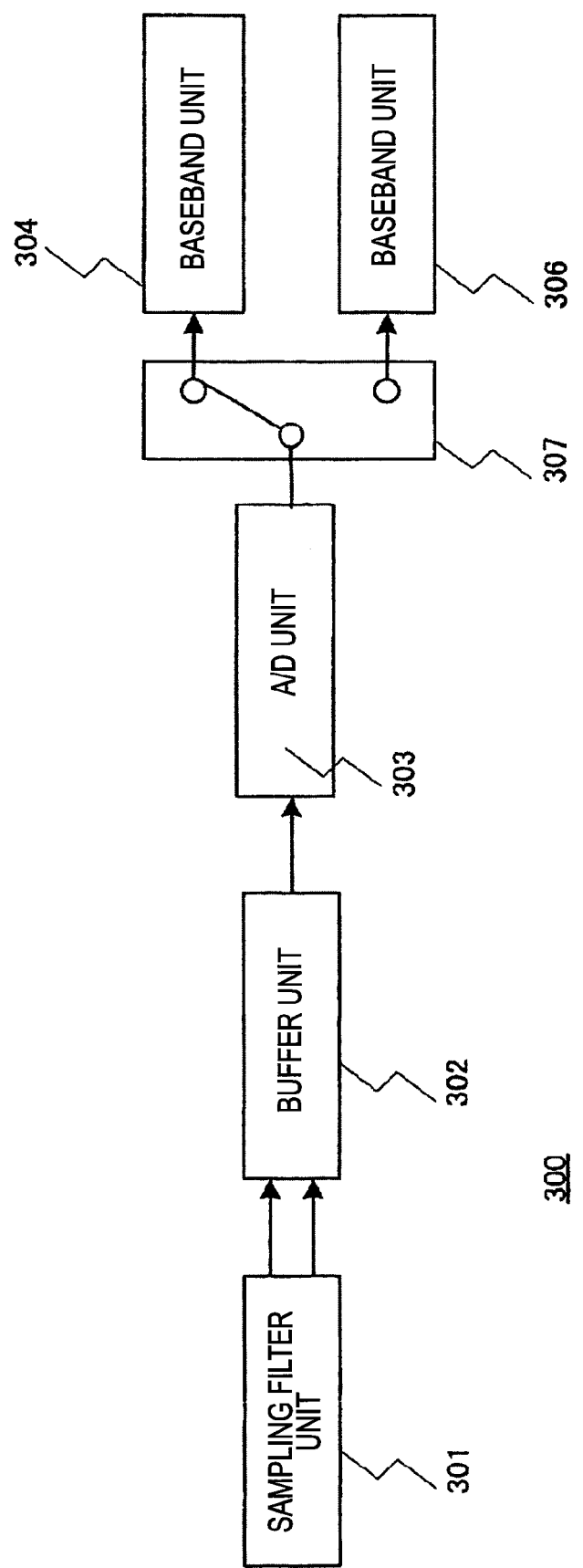
FIG. 7 is a block diagram for indicating an arrangement of a wireless communication apparatus according to a third embodiment of the present invention.
Figure 8:
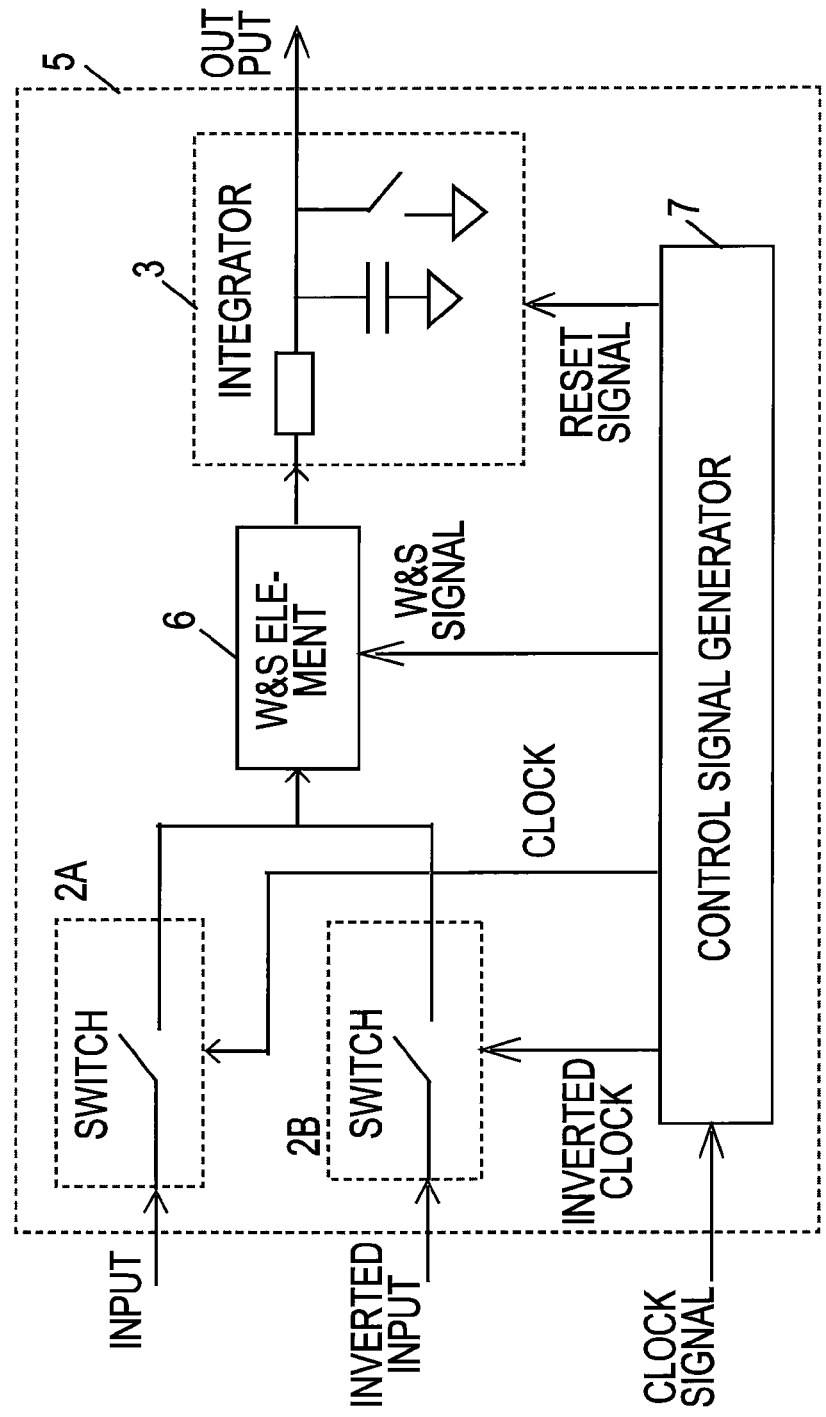
FIG. 8 is a block diagram for indicating the arrangement of the known sampling filter apparatus.
Figure 9:
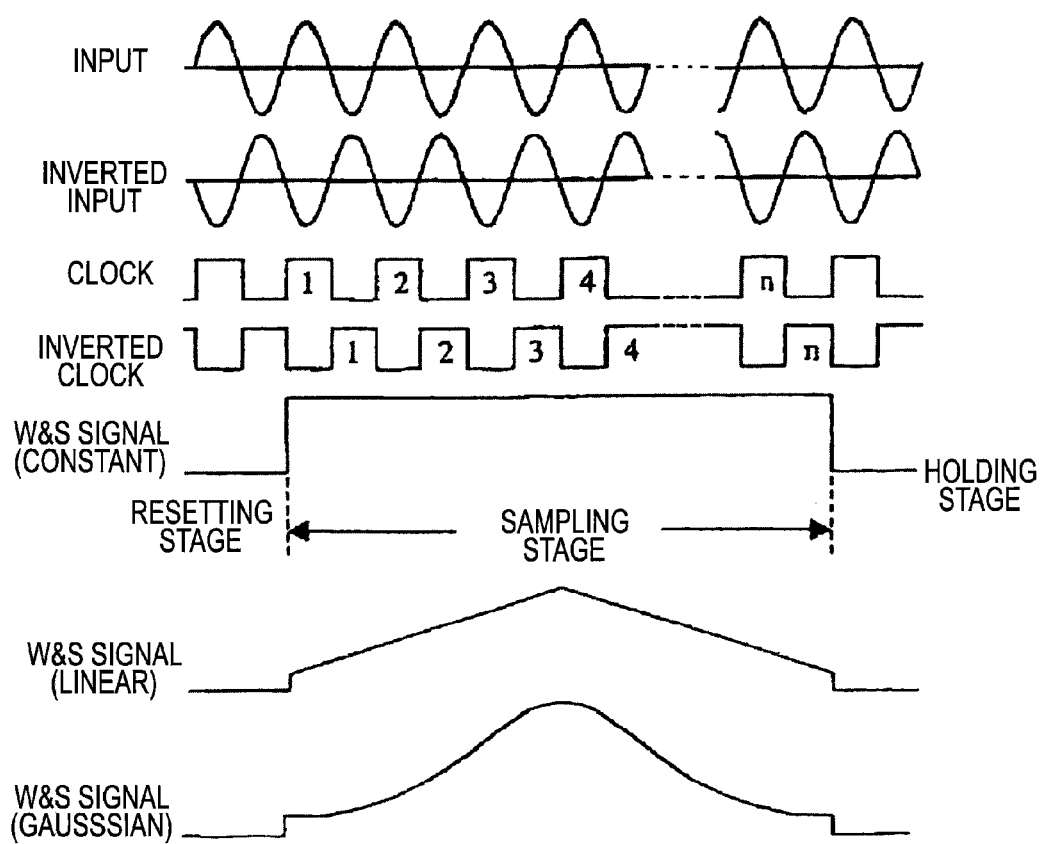
FIG. 9 is a waveform diagram for indicating the W & S signal of the known sampling filter apparatus.
Figure 10:
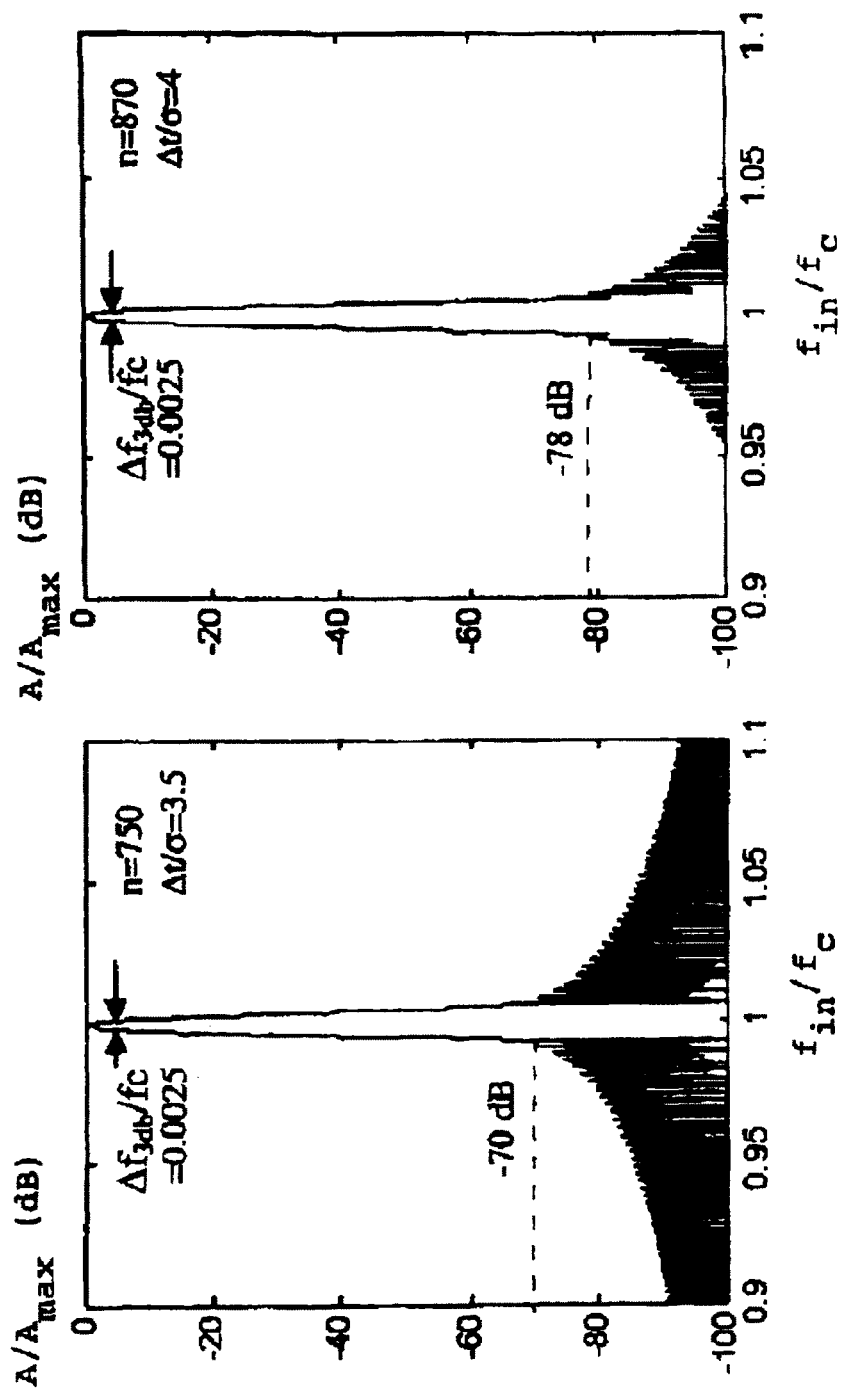
FIG. 10 is a diagram for explaining the reason why the frequency space becomes narrow in the known sampling filter apparatus.

FIG. 7 is a block diagram for showing an arrangement of a wireless communication apparatus according to a third embodiment of the present invention. In FIG. 7, the wireless communication apparatus 300 is equipped with a sampling filter unit 301, a buffer unit 302, an A/D unit 303, a first baseband unit 304, a second baseband unit 306, and a switch 307.

The sampling filter unit 301 has the same arrangement as that of the sampling filter apparatus 100 according to the first embodiment, and is operated in a similar manner to that of the sampling filter apparatus 100 so as to perform a discrete processing operation and a filtering process operation with respect to a radio frequency signal which is entered from the antenna 110. Moreover, since internal voltages of the voltage/current converters 120 to 123 are switched, amounts of electric charges charged in the capacitors can be changed.

Since the buffer unit 302 has a similar function to that of the buffer unit 202, the buffer unit 302 outputs voltage values appeared between both terminals of the capacitors 150 to 154 of the sampling filter unit 301. The A/D unit 303 converts the analog discrete signal entered from the buffer unit 302 into a digital signal. The first baseband unit 304 performs a digital signal processing operation with respect to the digital signal entered from the A/D unit 303 via the switch 307, while the first baseband unit 304 corresponds to a first wireless communication method.

The second baseband unit 306 performs a digital signal processing operation with respect to the digital signal entered from the A/D unit 303 via the switch 307, while the second baseband unit 306 corresponds to a second wireless communication method.

The switch 307 inputs the output of the A/D unit 303 to either the first baseband unit 304 or the second baseband unit 306 in correspondence with such a condition that a wireless communication method corresponds to either the first wireless communication method or the second wireless communication method.

Although the A/D unit is arranged at a pre-stage of the switch 307 in the present embodiment, another arrangement may be alternatively made in which the A/D unit may be arranged at a post stage of the switch 307, depending upon a wireless communication method.

In accordance with the above-described arrangement, since the filter characteristic of the sampling filter apparatus according to the first embodiment is changed, the sampling filter apparatus can be applied to such a wireless communication apparatus corresponding to a plurality of wireless communication methods.

As an example of the wireless communication methods, for example, the W-CDMA method and the IEEE 802.11a method may be conceived. Since the bandwidth of the W-CDMA method is approximately 4 MHz and the bandwidth of the IEEE 802.11a method is approximately 20 MHz, filters which are suitable for the respective methods are required. In accordance with the present embodiment, since the filter characteristic of the sampling filter apparatus can be varied, a single filter can be adapted to both the wireless communication methods. There is no specific restriction in the examples of the first wireless communication method and the second wireless communication method. Alternatively, the sampling filter unit 301 may be arranged in such a manner that the voltage/current converters may be switched in response to a wireless communication method to be used.

[Embodiment 4]

FIG. 14 is a block diagram for showing an arrangement of a wireless communication apparatus according to an embodiment 4 of the present invention. In FIG. 14, the wireless communication apparatus 400 has been equipped with a sampling filter unit 401, a switch 407, a first buffer unit 402, a second buffer unit 408, a first A/D unit 403, a second A/D unit 405, a first baseband unit 404, and a second baseband unit 406.

The sampling filter unit 401 has the same arrangement as that of the sampling filter apparatus 100 according to the first embodiment, and is operated in a similar manner to that of the sampling filter apparatus 100 so as to perform a discrete processing operation and a filtering process operation with respect to a radio frequency signal which is entered from the antenna 110.

The switch 407 switches the connection destinations of the discharging switches 180 to 184 of the sampling filter unit 401 to either the first buffer unit 402 or the second buffer unit 408.

Since the first buffer unit 402 and the second buffer unit 408 have a similar function to that of the buffer unit 202, the first buffer unit 402 and the second buffer unit 408 output voltage values appeared between both terminals of the capacitors 150 to 154 of the sampling filter unit 401.

The first A/D unit 403 and the second A/D unit 405 digitalize analog discrete signals which are inputted from the first buffer unit 402 and the second buffer unit 408, respectively.

The first baseband unit 404 and the second baseband unit 406 execute digital signal processing operations with respect to the digital signals entered from the first A/D unit 403 and the second A/D unit 405, respectively.

A description is made of such an operation that the sampling filter unit 401 is operated in response to a similar control signal to that shown in FIG. 2 in order that the switch 407 alternately switches the connection destinations of the discharging switches 180 to 184 of the sampling filter unit 401 to either the first buffer unit 402 or the second buffer unit 408 every 1 timing. In the control operations, at timing "1", the voltage value of the capacitor 151 is read by the buffer unit 402; at timing "2", the voltage value of the capacitor 152 is read by the buffer unit 408; at timing "3", the voltage value of the capacitor 153 is read by the buffer unit 402; at timing "4", the voltage value of the capacitor 154 is read by the buffer unit 408; at timing "5", the voltage value of the capacitor 150 is read by the buffer unit 402; at timing "6", the voltage value of the capacitor 151 is read by the buffer unit 408; at timing "7", the voltage value of the capacitor 152 is read by the buffer unit 402; at timing "8", the voltage value of the capacitor 153 is read by the buffer unit 408; at timing "9", the voltage value of the capacitor 154 is read by the buffer unit 402; and at timing "10", the voltage value of the capacitor 150 is read by the buffer unit 408. As a result, signals which are outputted from the first buffer unit 402 and the second buffer unit 408 are obtained in a similar control manner to that of FIG. 6. That is, such signals whose decimation ratio is 2 can be processed in the first baseband unit 401 and the second baseband unit 406.

In the present embodiment, the wireless communication apparatus is arranged by that the connection destinations of the discharging switches 180 to 184 are switched. Alternatively, a wireless communication apparatus may be arranged by that a plurality of discharging switches connected to the respective capacitors are provided. Also, a wireless communication apparatus may be alternatively arranged by that signals to be processed by baseband units are selected from the signals outputted from the first buffer unit 402 and the second buffer unit 408. In addition, the wireless communication apparatus may be arranged by that signals whose decimation ratio becomes 4 are processed by four sets of baseband units.

In accordance with the above-described alternative arrangement, the reception signals may be processed by employing a plurality of baseband units without any loss of amplitudes, which is caused by distributions.

Although the present invention has been described in detail, and with reference to the specific embodiments, it is obvious for ordinary skilled person in the art to conceive such a fact that the present invention can be modified and changed in various manners without departing from the scope and spirit of the present invention.

The present application claims priority from Japanese patent application (JP-A-2006-287307) filed on Oct. 23, 2006, the contents of which are hereby incorporated by reference into this application.

INDUSTRIAL APPLICABILITY

The present invention has an advantages to provide a sampling filter apparatus capable of performing the filtering operation utilizing the wide frequency space without executing the decimation, and also, capable of changing the filter characteristic thereof without requiring the complex controller, since the sampling filter apparatus is arranged in such a manner that when the electric charges are charged to the capacitors, the electric charges are weighted and the weighted electric charges are processed based upon the convolution instead of changing the control signal. There is such a merit that the sampling filter apparatus can be usefully employed as a filter, a mixer, and the like, which are employed in an analog circuit of a wireless communication apparatus.

The invention claimed is:

1. A sampling filter apparatus, the filter characteristic of which is determined in response to an output from an integrator, the apparatus comprising:
"N" pieces (symbol "N" is an integer larger than or equal to 2) of voltage/current converters which convert an input voltage into predetermined currents;
"N+1" pieces of integrators which integrate the currents outputted from the voltage/current converters to output the integrated current;
"N+1" pieces of charging switches which are provided at respective input stages of the "N+1" pieces of integrators;
"N+1" pieces of discharging switches which are provided at respective output stages of the "N+1" pieces of integrators;
a selecting switch which switches connections between the "N" pieces of voltage/current converters and the "N+1" pieces of charging switches; and
a controller which controls ON timing and OFF timing as to the "N+1" pieces of charging switches and the "N+1" pieces of discharging switches respectively with respect to each of the integrators, and controls timing of switching the connections by the selecting switch,
wherein the controller controls the ON timing and the OFF timing as to the charging switches and the discharging switches such that electric charges are charged from the "N" pieces of voltage/current converters into "N" pieces of the integrators selected from the "N+1" pieces of integrators, and at the same time, an electric charge is discharged from "1" piece of the integrator other than the "N" pieces of selected integrators.

2. The sampling filter apparatus as claimed in claim 1, wherein:
the controller controls the timing for switching the connections by the selecting switch such that switching of the connections between the "N" pieces of voltage/current converters and the "N+1" pieces of charging switches are carried out every 1 clock; and the controller controls such that ON states and OFF states of the respective charging switches and discharging switches are changed every 1 clock.

3. The sampling filter apparatus as claimed in claim 1, wherein:
when symbol "$z^{-n}$" (symbol "n" is an integer larger than or equal to 1) expresses a signal delayed by "n" samples:
in such a case that "N" is even (N=2M, symbol "M" is an integer larger than or equal to 1), the controller controls electric charges integrated by the plurality of integrators for 1 clock to be multiplied by "$a_1$" times to "$a_M$" times of the input voltages, and a transfer function "y" to be expressed by $y=a_1+a_2z^{-1}+ \ldots +a_Mz^{-M+1}+a_Mz^{-M} \ldots +a_2z^{-N+2}+a_1z^{-N+1}$; whereas
in such a case that "N" is odd (N=2M+1), the controller controls the electric charges integrated by the plurality of integrators for 1 clock to be multiplied by "$a_1$" times to "$a_{M+1}$" time of the input voltages, and the transfer function "y" to be expressed by $y=a_1+a_2z^{-1}+ \ldots +a_Mz^{-M+1}+a_{M+1}z^{-M}+a_Mz^{-M-}+ \ldots +a_2z^{-N+2}+a_1z^{-N+1}$.

4. The sampling filter apparatus as claimed in claim 1, wherein:
the controller switches internal voltages of the voltage/current converters so as to control to switch amounts of electric charges entered to the integrators.

5. The sampling filter apparatus as claimed in claim 1, wherein:
the "N" pieces of voltage/current converters have voltage-to-current characteristics which are different from each other.

6. The sampling filter apparatus as claimed in claim 2, wherein:
the switch which switches the connections between the "N" pieces of voltage/current converters and the "N+1" pieces of integrators includes:
a selecting switch for switching inputs from the "N" pieces of voltage/current converters to "N+1" pieces of outputs in response to a signal supplied from the controller; and
"N+1" pieces of sampling switches for sampling the "N+1" pieces of outputs from the selecting switch in response to a signal supplied from the controller, and for supplying the sampled outputs to the "N+1" pieces of integrators.

7. The sampling filter apparatus as claimed in claim 2, wherein:
the switch which switches the connections between the "N" pieces of voltage/current converters and the "N+1" pieces of integrators includes:
a selecting switch for switching inputs from the "N" pieces of voltage/current converters to "N+1" pieces of outputs in response to a signal supplied from the controller; and
"N" pieces of sampling switches for sampling outputs from the "N" pieces of voltage/current converters in response to a signal supplied from the controller, and for supplying the sampled outputs to the "N+1" pieces of integrators.

8. A wireless communication apparatus, comprising:
the sampling filter apparatus recited in claim 1, which performs a discrete processing operation and a filtering process operation with respect to a radio frequency signal inputted from an antenna;
a buffer unit which outputs voltages between both terminals of the plurality of integrators employed in the sampling filter apparatus;

an A/D unit which digitalizes an analog signal which has been discrete-processed and outputted from the buffer unit; and a baseband unit which performs either a demodulating process operation or a decoding process operation with respect to a digital signal digitalized by the A/D unit.

9. A wireless communication apparatus, comprising:

the sampling filter apparatus recited in claim 1, which performs a discrete processing operation and a filtering process operation with respect to a radio frequency signal inputted from an antenna, and switches an internal voltages of the voltage/current converters in correspondence with either a first wireless communication method or a second wireless communication method so as to change amounts of electric charges charged into the plurality of integrators;

a buffer unit which outputs voltages between both terminals of the plurality of integrators employed in the sampling filter apparatus;

an A/D unit which digitalizes an analog signal which has been discrete-processed and outputted from the buffer unit;

a switch unit which switches outputs of the A/D unit in correspondence with either the first wireless communication method or the second wireless communication method;

a first baseband unit which performs either a demodulating process operation or a decoding process operation with respect to a digital signal outputted via the switch unit from the A/D unit in correspondence with the first wireless communication method; and a second baseband unit which performs either a demodulating process operation or a decoding process operation with respect to a digital signal outputted via the switch unit from the A/D unit in correspondence with the second wireless communication method.

* * * * *